(12) United States Patent
Li

(10) Patent No.: US 6,850,458 B2
(45) Date of Patent: Feb. 1, 2005

(54) CONTROLLING DATA STROBE OUTPUT

(76) Inventor: Wen Li, 2427 E. Glouscester St., Boise, ID (US) 83706

(*) Notice: Subject to any disclaimer, the term of this patent is extended or adjusted under 35 U.S.C. 154(b) by 79 days.

(21) Appl. No.: 10/294,425

(22) Filed: Nov. 14, 2002

(65) Prior Publication Data
US 2004/0095838 A1 May 20, 2004

(51) Int. Cl.$^7$ ................................. G11C 8/00
(52) U.S. Cl. ....................... 365/233; 365/194
(58) Field of Search ................... 365/233, 194

(56) References Cited

U.S. PATENT DOCUMENTS 6,556,489 B2 * 4/2003 Gomm et al. ............... 365/194
2003/0002357 A1 * 1/2003 Kwon et al. ................. 365/194
2004/0037159 A1 * 2/2004 Gomm et al. ............... 365/233

* cited by examiner

Primary Examiner—Anh Phung
Assistant Examiner—Pho M. Luu
(74) Attorney, Agent, or Firm—Williams, Morgan & Amerson, P.C.

(57) ABSTRACT

A method and apparatus is provided for controlling a data strobe. A latency of operation relating to a data operation of a device is determined. A delay lock loop signal is generated for the data operation of the device. The delay lock loop signal is compared to an external clock to determine a phase difference. A determination is made as to whether the delay lock loop signal is early based upon the phase difference. A signal is adjusted in response to the latency of operation is performed based upon the determination that the delay lock loop signal is early.

44 Claims, 8 Drawing Sheets

CONTROLLING DATA STROBE OUTPUT

BACKGROUND OF THE INVENTION

1. Field of the Invention

This invention generally relates to semiconductor memory devices, and, in particular, to controlling a data strobe signal for accessing memory in a memory device.

2. Description of the Related Art

Modern integrated circuit devices are comprised of millions of semiconductor devices, e.g., transistors, formed above a semiconductor substrate, such as silicon. These devices are very densely packed, i.e., there is little space between them. Similarly, densely packed electrically conducting lines may also be formed in the semiconductor substrate. By forming selected electrical connections between selected semiconductor devices and selected conducting lines, circuits capable of performing complex functions may be created. For example, bits of data may be stored by providing electrical current to a plurality of bit lines and an orthogonal plurality of wordlines that may be electrically coupled to one or more capacitors in a semiconductor memory.

The semiconductor memory may be a dynamic random access memory, a flash memory, and the like. The semiconductor memory typically comprises an array of memory cells, address decoding circuitry for selecting one, or a group, of the memory cells for reading or writing data, sensing circuitry for detecting the digital state of the selected memory cell or memory cells, and input/output lines to receive the sensed data and convey that information for eventual output from the semiconductor memory. In many cases, the array of memory cells will be sub-divided into several sub-arrays, or subsets, of the complete collection of memory cells. For example, a semiconductor memory having 16 megabits ($2^{24}$ bits) of storage capacity, may be divided into 64 sub-arrays, each having 256K ($2^{18}$) memory cells.

Flash memory (sometimes called "flash RAM") is a type of non-volatile memory that can be erased and reprogrammed in units of memory called blocks. Flash memory is a variation of electrically erasable programmable read-only memory (EEPROM) that, unlike flash memory, is erased and rewritten at the byte level, which is slower than flash memory updating. Flash memory is commonly used to hold control code such as the basic input/output system (BIOS) in a personal computer. When BIOS needs to be changed (rewritten), the flash memory can be written in block (rather than byte) sizes, making it faster to update. Applications employing flash memory include digital cellular phones, digital cameras, LAN switches, computers, digital set-up boxes, embedded controllers, and other devices. These applications generally call for extensive memory access.

Accessing memory requires a circuit to capture the address and data at precise timing in relation to clock signals that drive a circuit. Errors occurring during the capturing of addresses and data may cause errors in accessing the data stored in memory. Many times external factors, such as temperature drifts, voltage-level drifts, and the like, can affect a window of a time period when data and/or addresses may be captured by a circuit. In order to acquire, access, or capture data and/or addresses during transfer of memory data from one device to another, precise clocking of the data and addresses and their timing is desirable.

Many of today's memory devices, such as double data rate RAM devices (DDR RAM), require intricate timing schemes for proper operation. Often external clocks may be used to clock the operations of the memory device, which may be prompted by an external device such as a processor. The memory devices may contain an inherent latency in the operation and reaction to commands and clock signals from external sources. For example, there may be an inherent latency between the time that an external device, such as a processor, makes a request or sends a command for a particular memory operation to the memory device, and the time that the memory device actually reacts to such instructions.

Typically, digital systems, such as memory systems, may comprise a delay lock loop that may be used to align the edges of a plurality of digital signals. For example, a delay lock loop circuit may be used to align the rising edge and/or the falling edge of a clock signal based upon an external or system clock (which may be used as a reference clock signal), to produce a synchronized clock signal. Many times, digital signals from multiple sources access one or more memory spaces in a memory unit. It is desirable that these digital signals be synchronized for proper access of memory. Typical delay lock loops comprise a phase detect unit that detects the phase differences between a plurality of signals. The output of the phase detect unit is then used to affect the operation of a filter that adjusts the delay of an output of the delay lock loop.

In timing sensitive applications such as DDR RAM applications, the latency time and the proper reaction to external commands becomes important in assuring proper memory operations. For example, a read signal sent to the DDR RAM or a memory device, may prompt a reaction by the memory device to provide data on a data bus in reaction to the read request. However, external factors, such as changes in operating voltage and changes in temperature during the operation of the device, may cause a change in the operation timing of the device. Changes in the operation timing may cause a device to provide data at a time when the data bus access may not be valid, causing operation errors.

The present invention is directed to overcoming, or at least reducing the effects of, one or more of the problems set forth above.

SUMMARY OF THE INVENTION

In one aspect of the instant invention, a device is provided for controlling a data strobe. The device of the present invention comprises a delay lock loop that is capable of providing a delayed signal based upon a phase difference between a reference signal and a feedback signal. The device of the present invention also comprises a phase detect unit operatively coupled to the delay lock loop. The phase detect unit is adapted to detect a phase difference between the delayed signal and an external signal to adjust a signal in response to a latency associated with the device.

In another aspect of the instant invention, a circuit is provided for controlling a data strobe. The circuit of the present invention comprises a delay lock loop (DLL) unit to receive a reference signal and provide a delay upon the reference signal to generate a delayed reference signal; a DLL rising and falling edge generator operatively coupled with the delay lock loop unit. The DLL rising and falling edge generator is capable of generating a DLL rising edge signal and a DLL falling edge signal for performing a double data rate (DDR) data operation. The circuit also includes a phase detect unit to detect a phase difference between the delayed reference signal and an external signal for adjusting a timing of a data valid signal that indicates that data at an output terminal relating to the circuit is valid, based upon a latency of operation of the circuit in response to a determination that the phase difference indicates that the delayed reference signal is early.

In another aspect of the instant invention, a system board is provided for controlling a data strobe. The system board of the present invention comprises a first device comprising a memory location for storing data and a clock control unit. The clock control unit comprises a delay lock loop to provide a delayed signal based upon a phase difference between a reference signal and a feedback signal and a phase detect unit operatively coupled to the delay lock loop. The phase detect unit is capable of detecting a phase difference between the delayed signal and an external signal to adjust a reaction to a latency associated with the first device in response to a determination that the phase difference indicates that the delayed signal is early. The system board also comprises a second device operatively coupled to the first device, the second device to access data from the first device based upon an operation performed by the delay lock loop.

In yet another aspect of the instant invention, a memory device is provided for controlling a data strobe. The memory device of the present invention comprises a delay lock loop to provide an output signal based upon a phase difference between a reference signal and a feedback signal. The delay lock loop comprises a phase detect unit to detect a phase difference between the delayed signal and an external signal to adjust a reaction to a latency associated with the device.

In another aspect of the instant invention, a method is provided for controlling a data strobe. A latency of operation relating to a data operation of a device is determined. A delay lock loop signal is generated for the data operation of the device. The delay lock loop signal is compared to an external clock to determine a phase difference. A determination is made as to whether the delay lock loop signal is early based upon the phase difference. A signal is adjusted in response to the latency of operation is performed based upon the determination that the delay lock loop signal is early.

In yet another aspect of the present invention, a computer readable program storage device encoded with instructions is provided for controlling a data strobe. A computer readable program storage device encoded with instructions that, when executed by a computer, performs a method, which comprises: determining a latency of operation relating to a data operation of a device; generating a delay lock loop signal for the data operation of the device; comparing the delay lock loop signal to an external clock to determine a phase difference; determining whether the delay lock loop signal is early based upon the phase difference; and adjusting a signal in response to the latency of operation based upon the determination that the delay lock loop signal is early.

BRIEF DESCRIPTION OF THE DRAWINGS

The invention may be understood by reference to the following description taken in conjunction with the accompanying drawings, in which like reference numerals identify like elements, and in which.

Figure 1:
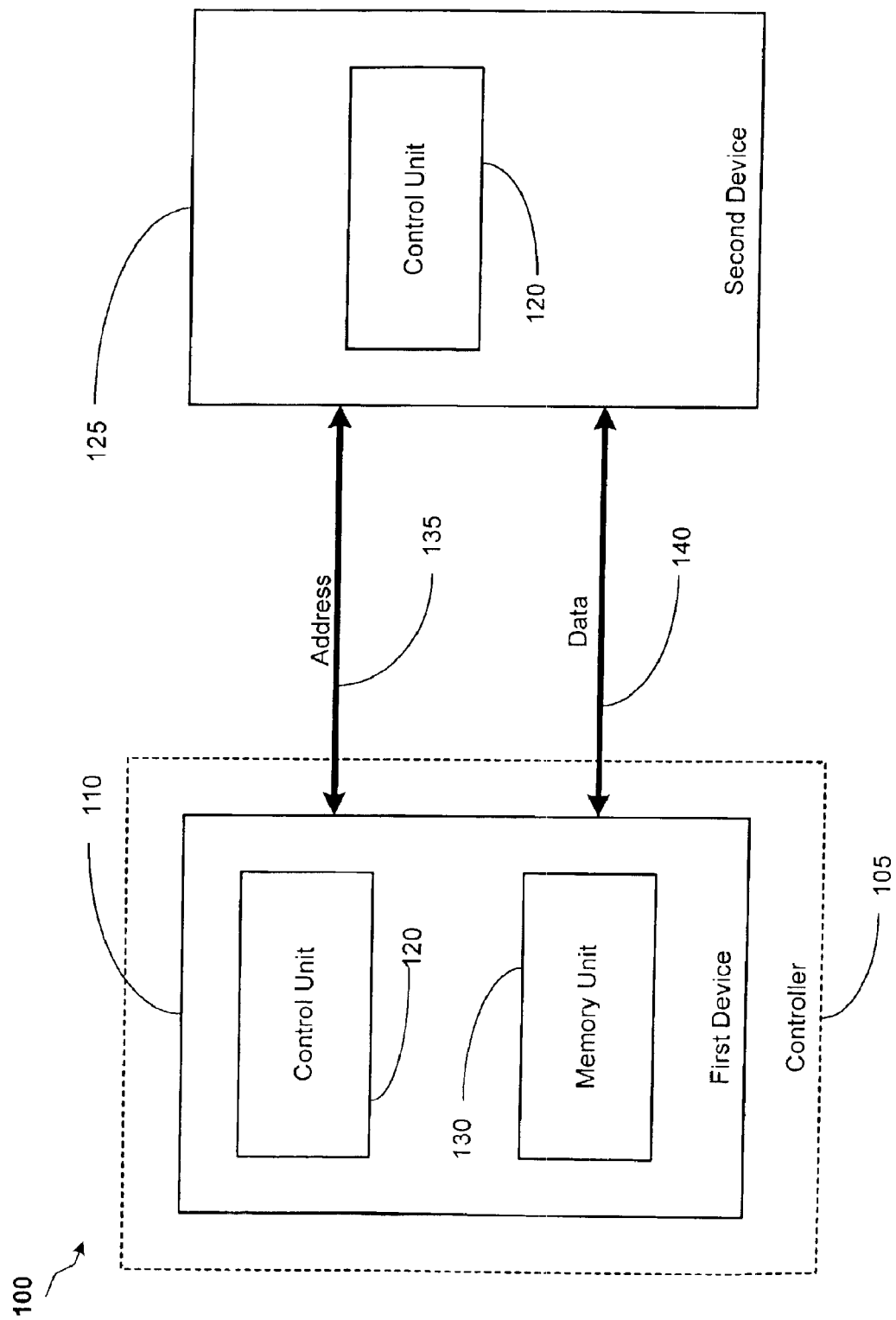
FIG. 1 is a block diagram of a system including a device that is capable of accessing digital signals, in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The timing of circuit operations is important for the proper operation of digital systems. Access of data/addresses, such as latching addresses and/or data, within precisely defined time periods is useful to ensure that data and/or addresses are properly captured by a device. Embodiments of the present invention provide for a clock control unit to adjust the operation timing of an electronic device, such as a memory device. Embodiments of the present invention provide for employing delay lock loop circuitry and adjusting one or more data-access control signals to provide more accurate timing for operations of the device. Embodiments of the present invention provide for reacting to timing changes caused by external factors, such as changes in operation voltage, temperature, or other factors, and dynamically adjusting operating signals, such as data access signals. Embodiments of the present invention provide for a phase detect function for detecting a phase difference between an operation clock and a delay lock loop adjusted clock in order to provide a signal to compensate for latency in the operation of the device.

Referring to FIG. 1, a block diagram of a system 100 is illustrated, in accordance with one embodiment of the present invention. The system 100 comprises a first device 110, which, in one embodiment, may comprise a memory unit 130 capable of storing data. In one embodiment, the memory unit 130 may be a dynamic random access memory (DRAM), a static random access memory (SRAM), a double-data rate synchronous DRAM (DDR SDRAM), a Rambus™ DRAM (RDRAM), a FLASH memory unit, or the like. The first device 110 may be encompassed by a controller 105. In one embodiment, the controller 105 may be a memory controller, a computer system, such as a personal computer, and the like. In one embodiment, the controller 105 may be a system board, such as a motherboard, for a computer system. The first device 110 may be accessed by a second device 125, which, in one embodiment, may be an accessing/access device. The second device 125 may send addresses on a line 135 to the first device 110. The first device 110 may then provide data to the second device 125 on a line 140. The first and second devices 110, 125 may comprise a control unit 120 capable of accessing data (including code) stored in the memory unit 130 of the first device 110. The second device 125 may be any device that uses the first device 110 to store data, read data, or both. Examples of the second device 125 may include, but are not limited to, a computer, a camera, a telephone, a television, a radio, a calculator, a personal digital assistant, a network switch, and the like.

The control unit 120, in one embodiment, may manage the overall operations of the second device 125, including writing and reading data to and from the first device 110. The control unit 120 may comprise a microprocessor, a microcontroller, a digital signal processor, a processor card (including one or more microprocessors or controllers), a memory controller, or other control or computing device.

In one embodiment, the first device 110 may be a memory chip device, such as a DRAM device, an SRAM device, a FLASH memory device, and the like. In one embodiment, the first device 110 may be a memory chip device that may be implemented into a digital system, such as a computer system. In an alternative embodiment, the first device 110 may be an external memory, such as a memory stick, and may be accessed when inserted into a slot of the second device 125. When inserted into the slot, the second-device 125 may provide the appropriate power and control signals to access memory locations in the first device 110. The first device 110 may be external to, or internal (e.g., integrated) to, the second device 125. The second device 125, which may be a computer system, may employ a first device 110 (in the form of a memory unit) that is integrated within the computer system to store data (e.g., BIOS [basic input/output system]) related to the computer system.

Figure 2:
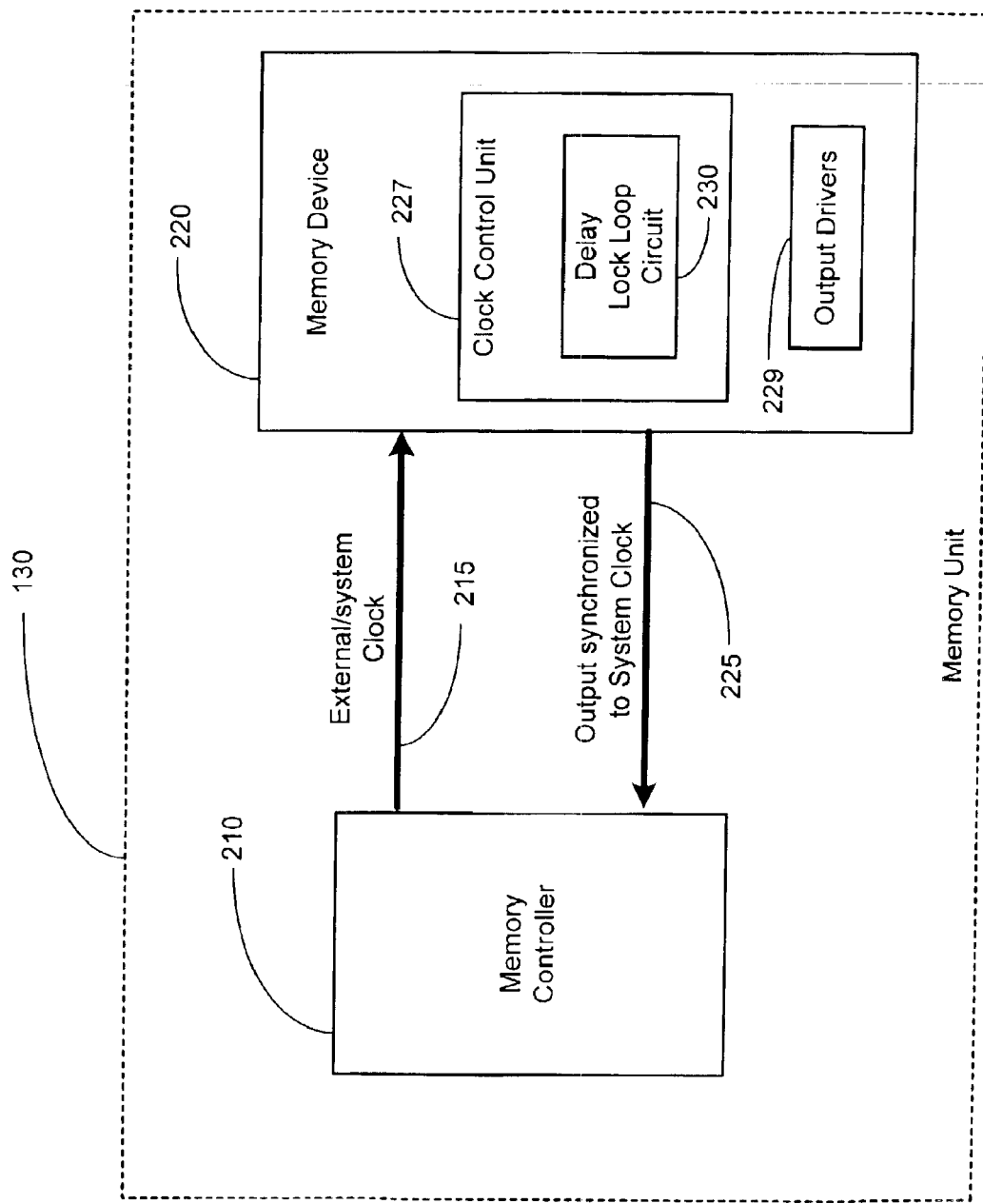
FIG. 2 is a more detailed block diagram representation of the memory unit of FIG. 1, in accordance with one illustrative embodiment of the present invention.

Turning now to FIG. 2, a more detailed block diagram depicting the memory unit 130 in accordance with one illustrative embodiment of the present invention is provided. In one embodiment, the memory unit 130 comprises a memory controller 210, which is operatively coupled to one or more memory devices 220. The memory controller 210 may comprise circuitry that provides access (e.g., such as storing and extracting data to and from the memory devices 220) to control operations of the memory unit 130. The memory device 220 may be an array of memory storing modules that are capable of storing data.

Proper timing of the data signals carrying data from the memory device 220 is useful in extracting data accurately. For example, if the period of a system clock is 5 nanoseconds, and the data is to be sent or received on every clock edge of the system clock on a line 215 (e.g., as in the case of a double data rate [DDR SDRAM]) then there is a 2.5 nanosecond maximum timing window available to send or receive the data. Therefore, a delay lock loop may be employed to synchronize various digital signals (e.g., operation clocks, data signals, etc.) to ensure that data access is performed within acceptable timing windows.

The memory device 220 comprises a clock control unit 227 capable of performing a plurality of clock control and/or timing operations related to the operation and access of data to and from the memory device 220. The clock control unit 227 may comprise a delay lock loop (DLL) circuit 230. In alternative embodiments, the delay lock loop circuit 230 may reside in other portions of the memory unit 130, such as in the memory controller 210. The delay lock loop circuit 230 is capable of locking a plurality of digital signals based upon two reference clock signals or an input clock and an external or system clock (which may be used as a reference clock signal) on a line 215. In this case, the external or system clock is reference to the data output. A delay clock generated by the delay lock loop circuit 230, which may be used to synchronize the output signal carrying data from the memory device 220 to an external clock, such as a clock derived from a system clock. The memory device 220 is capable of providing one or more output signals to the memory controller 210 based upon a external or system clock received by the memory device 220. The external/system clock may be generated by the memory controller 210 and/or from a component external to the memory unit 130, such as the control unit 120.

In one embodiment, the memory device 220 receives a system clock on a line 215 from the memory controller 210. The delay lock loop circuit 230 is capable of utilizing the system clock on the line 215 and providing an output synchronized to the system clock on a line 225. The memory controller 210 may use the output that is synchronized to the system clock on the line 215 to supply data to outside sources, such as the second device 125 and/or various components associated with the first device 110. Improvements in delay lock loop synchronization of digital signals may result in more accurately and efficiently storing and/or extracting data to and from the memory device 220.

Using the delay lock loop circuit 230 in the clock control unit 227, multiple signals may be synchronized for effective and accurate transmission of data. A more detailed description and illustration relating to the clock control unit 227 is provided below. Furthermore, the memory device 220 may also comprise one or more output drivers 229 capable of driving a plurality of signals such as data signals and/or data strobe signals indicating that data signals are valid. A more detailed description of the output drivers 229 and the delay lock loop circuit 230 is provided below.

Figure 3:
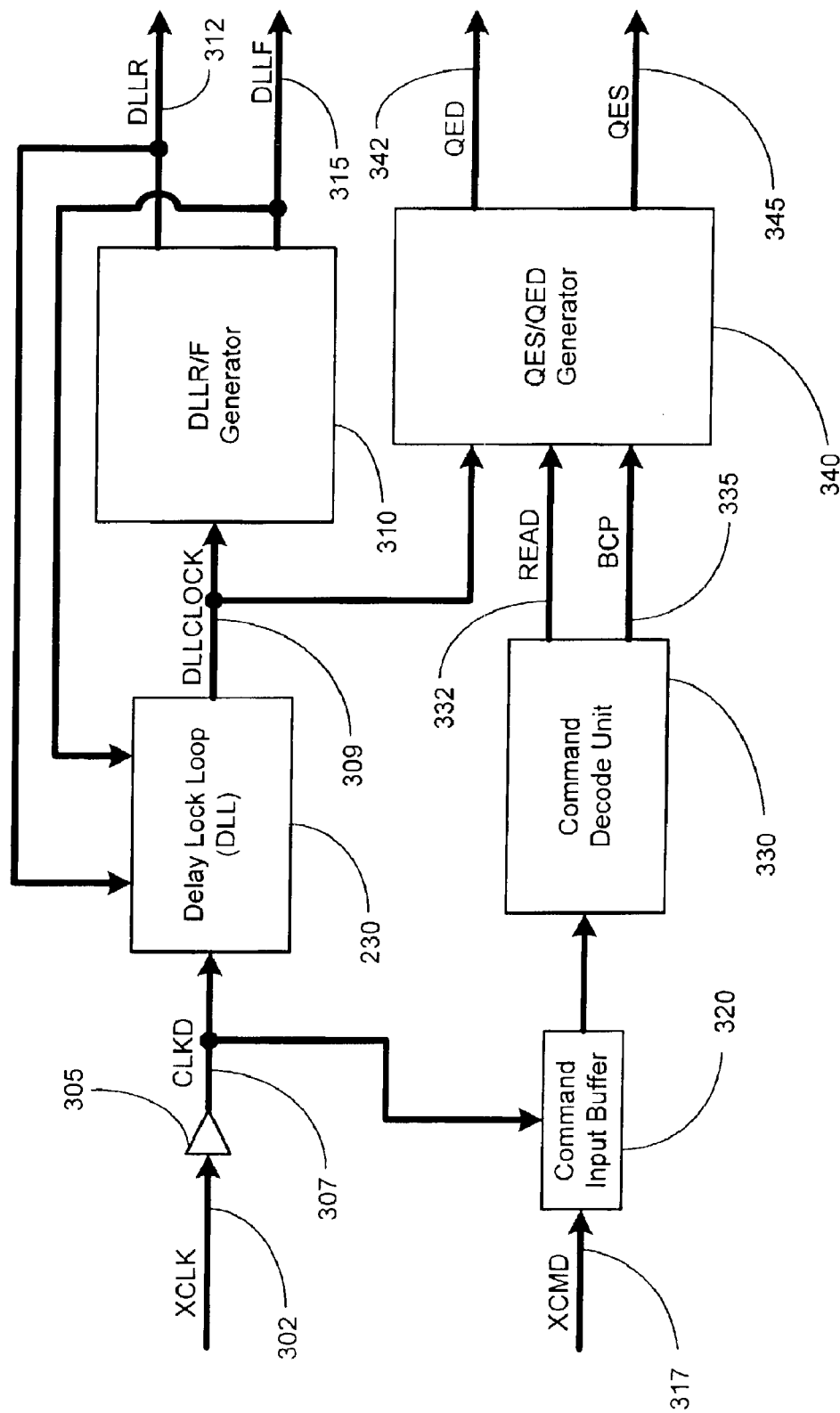
FIG. 3 illustrates a more detailed block diagram representation of a clock control unit of FIG. 2, in accordance with one illustrative embodiment of the present invention.

Turning now to FIG. 3, a more detailed block diagram description of the clock control unit 227 in accordance with embodiments of the present invention is illustrated. The clock control unit 227 may receive an external operation clock (XCLK) on a line 302. Generally, the clock control unit 227 buffers XCLK 302 using a buffer 305. The buffer 305 then provides an operation clock (CLKD) on a line 307. The operation clock CLKD 307 is utilized by the delay lock loop circuit 230 to produce a delay lock loop clock (DLLCLOCK) on a line 309. The DLLCLOCK on the line 309 is a delayed clock that is used to synchronize the operation of the memory device 220 to an external device such as a memory controller 210 or other external devices.

The DLLCLOCK 309 is then sent to a DLL rising/falling (DLLR/F) generator 310. The DLLR/F generator 310 produces two signals for use by the memory device 220 to strobe data onto a memory data bus associated with the memory device 220. The DLLR/F generator 310 produces a delay lock loop (DLL) rising edge signal (DLLR) and a DLL falling edge signal (DLLF) on a line 312 and 315, respectively. The DLLR 312 and DLLF 315 are also fedback to the DLL 230. For DDR RAM type devices, two edges, the rising edge and the falling edge, of the clock signal may be used to clock in or out data to and from the memory device 220. The DLL is used to access data from the memory device 220. The DLL rising and falling edge signals 312, 315 are used by the output drivers 229 to drive a plurality of signals such as data signals and data strobe signals for accessing data from the memory device 220. A more detailed description of the operation of the output driver 229 is provided in FIG. 4 and accompanying descriptions below.

The clock control unit 227 may also receive an external command signal (XCMD) on a line 317. The command signal 317 may carry data relating to operation commands from an external source, such as the memory controller 210 or other external sources, for accessing the memory device 220. In one embodiment, the XCMD signal 317 is a four-bit signal. In alternative embodiments, the XCMD signal 317 may comprise a larger or smaller number of bits. A command input buffer 320, which buffers the XCMD signal 317, receives the XCMD signal on the line 317. Subsequently, the buffered XCMD signal 317 is sent to a command decode unit 330. The command decode unit 330 is capable of decoding and/or deciphering the commands received from an external source and generating one or more signals that are indicative of the decoded command. In one embodiment, the command decode unit 330 generates a read signal (READ) on a line 332 and a burst complete signal (BCP) on a line 335. The assertion of the READ signal 332 is generated in reaction to a coded READ command signal received and decoded from the XCMD signal 317. Furthermore, the BCP signal 335 is generated by the command decode unit 330 in response to receiving the command that a burst operation is complete, which is decoded from the XCMD signal on the line 317.

The clock control unit 227 also comprises a QES/QED generator 340. QES refers to the DQS output enable signal and QED[0:n] (n=integer) refers to the DQ output enable signals. The QES/QED generator 340 is capable of generating a precursor signal for enabling the data and another precursor signal for enabling a strobe signal that indicates when data is valid on a data bus. The QES/QED generator 340 receives the READ signal 332, the BCP signal 335, and the DLLCLOCK signal 309. Based upon these signals, the QES/QED generator 340 generates a QED signal on a line 342. The QED signal 342 is a precursor signal that enables the output drivers 229 to output memory data that may be used by an external device such as a memory controller 210. The QES/QED generator 340 may also generate a QES signal on a line 345. The QES signal 345 is a precursor signal that may be used by the output drivers 229 to enable the data strobe signal. Based upon the QED and the QES signals 342, 345, the output drivers 229 provide data as well as a data strobe, to an external device such as the memory controller 210. A more detailed description of the QES/QED generator 340 is provided in FIG. 5 and accompanying description below.

Figure 4:
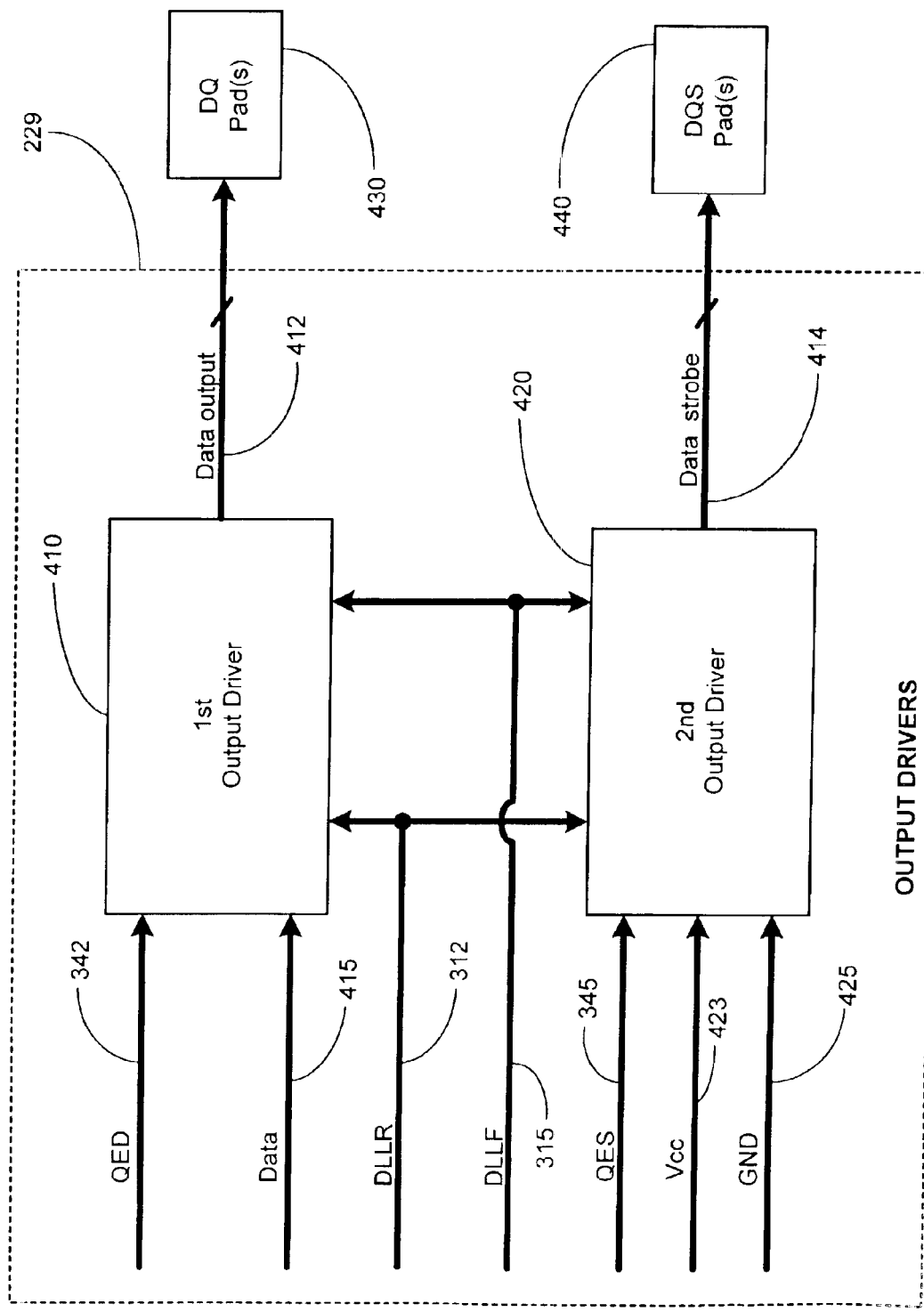
FIG. 4 illustrates a more detailed block diagram depiction of an output driver of FIG. 2, in accordance with one illustrative embodiment of the present invention.

Turning now to FIG. 4, a more detailed illustration of the output drivers 229, in accordance with embodiments of the present invention is illustrated. In one embodiment, the output drivers 229 may comprise a plurality of drivers, such as a first output driver 410 and a second output driver 420. Those skilled in the art having benefit of the present disclosure may provide additional drivers for driving additional signals. The first output driver 410 may comprise a plurality of drivers for driving a plurality of data bits (e.g., 4-bit or a 32-bit data output). The second output driver 420 may comprise a plurality of drivers for driving one or more data strobes. In one embodiment, the first output driver 410 drives one or more data outputs on a line 412, which may be provided to one or more data (DQ) pad(s) 430. A second output driver 420 generates one or more data output strobe on a line 414, which may be provided to one or more data strobe (DQS) pad(s) 440 for access by external components. By monitoring the strobe signal(s) on the DQS pad(s) 440, an external component is able to decipher when data on the DQ pad(s) 430 is valid.

The first output driver 410 receives the QED signal on the line 342 from the QES/QED generator 340. The QES/QED generator 340 may take into account the latency inherent to a particular device. The QES/QED generator 340 may use the BURST control (i.e., the BCP 335 signal), along with latency factors, for generating the QES and the QED signals 342, 345. Along with the QED signal 342, the first output driver 410 also receives data signals on a line 415. The data signals 415 may be sent to the first output driver 410 in the form of an array of signals. The first output driver 410 may operate on the rising edge as well as the falling edge of clock signals for a DDR type device. The first output driver 410 utilizes the DLLR signal 312 and the DLLF signal 315 to perform operation(s) on the rising and falling edge of clock signals. Based upon the DLL rising and falling edges provided by the DLLR and the DLLF signals 312, 315, the first output driver 410 utilizes the QED signal 342 to cause the data from the line 415 to be valid on the data output signal line 412 on rising and falling edges. Therefore, the first output driver 410 may provide data on the data output signal line 412 based upon rising and falling edges of the DLL clocks and synchronize the output data to external clock XCLK (302), and provide such data on the DQ pad(s) 430.

The second output driver 420 also receives the rising and falling edges of the delay lock loop-influenced clock signals DLLR, DLLF 312, 315, and uses the QES signal 345 from the QES/QED generator 340 to generate a strobe signal that indicates to an external component that the data output signal on the DQ pad 430 is in a valid state. The DLLR signal 312 and DLLF signal 315 may be used by the second output driver 420 to generate a rising edge and falling edge signal which is synchronized with XCLK 302.

Figure 5:
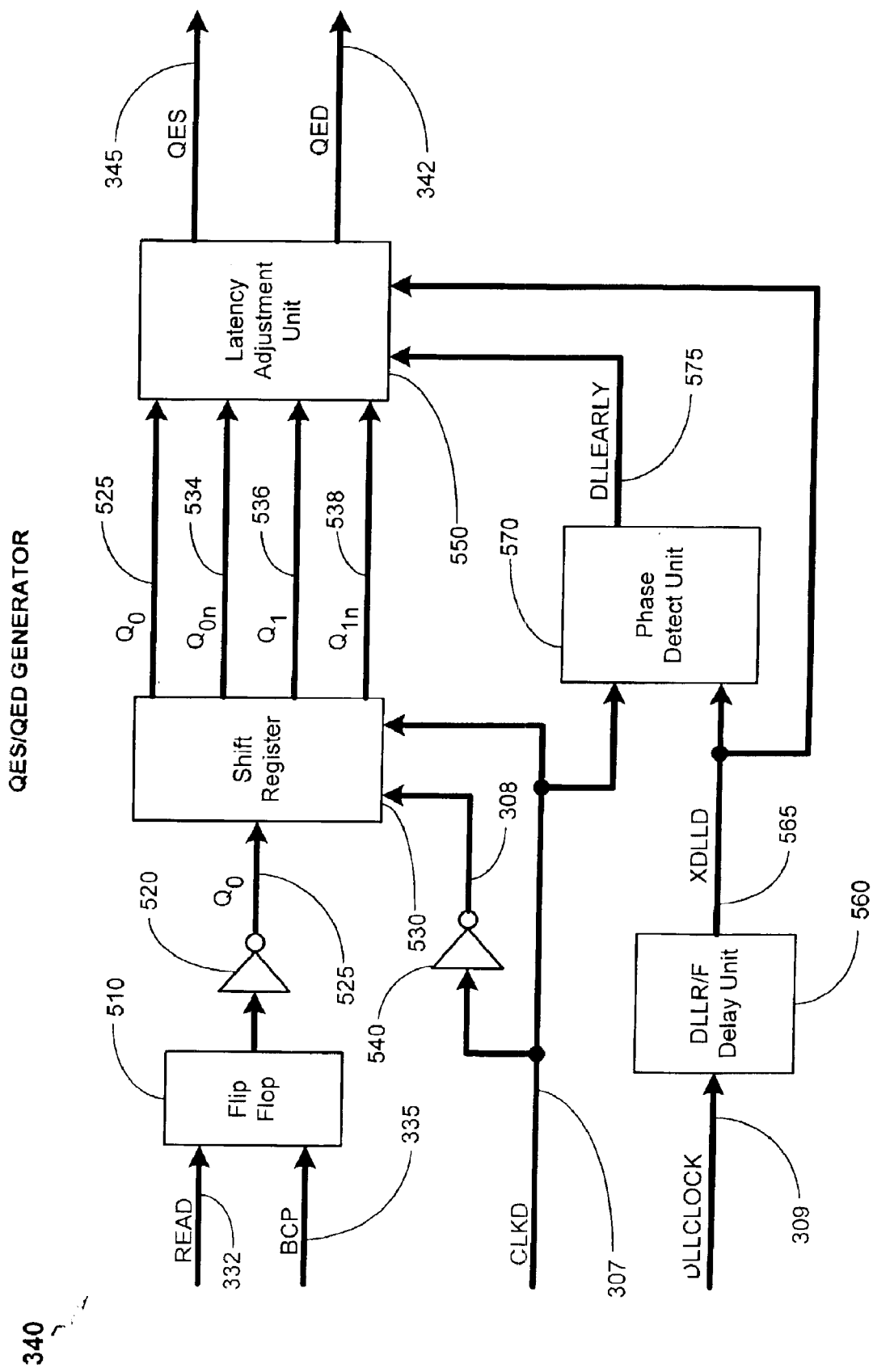
FIG. 5 illustrates a more detailed block diagram depiction of a QES/QED generator unit of FIG. 3, in accordance with one illustrative embodiment of the present invention.

Turning now to FIG. 5, a more detailed block diagram illustration of the QES/QED generator 340 in accordance with embodiments of the present invention is illustrated. The QES/QED generator 340 receives the READ signal 332 and the BCP signal 335 from the command decode unit 330. The READ signal 332 and the BCP signal 335 may be used in a flip flop format (e.g., an SR flip flop) utilizing the flip flop 510. The output from the flip flop 510, which is based upon the READ and the BCP signals 332, 335, is then inverted by an inverter 520 to produce the signal $Q_0$ on a line 525. The $Q_0$ signal 525 is then sent to a shift register 530, which is capable of shifting the $Q_0$ signal 525 to produce a plurality of strobe signals that may be used to generate the QES signal 345. The shift register 530 is driven by the clock signal CLKD 307, which is the buffered version of the XCLK 302, and by an inverted version of CLKD 307, which is inverted by an inverter 540 to produce the inverted CLKD signal on a line 308. A more detailed description of the shift register 530 is provided in FIG. 6 and accompanying description below.

Through various digital shift mechanisms, the shift register 530 produces a $Q_0$ signal on the line 525, a $Q_{0n}$ signal on the line 534, which is a delayed version of the $Q_0$ signal 525, a $Q_1$ signal 536, and a $Q_{1n}$ signal on a line 538. In one embodiment, the "Q" signals ($Q_0$, $Q_{0n}$, $Q_1$, and $Q_{1n}$) may be represented by the $Q_0$ signal having no delay, the $Q_{0n}$ signal being delayed by ½ clock cycle, the $Q_1$ signal being delayed by 1 clock cycles, and the $Q_{1n}$ signal being delayed by 1½ clock cycles, and so on, where n is an integer. The Q signals ($Q_0$, $Q_{0n}$, $Q_1$, and $Q_{1n}$) 525, 534, 536, 538 generally represent strobe signals that may be used by the QES/QED generator 340 to generate the QES and the QED signals 345, 342. The Q signals 525, 534, 536, 538 are sent to a latency adjustment unit 550, which utilizes a DLLEARLY signal on a line 575 (which is described in more detail below) to generate the QES and the QED signals 345, 342.

The QES/QED generator 340 receives the digital delayed clock signal DLLCLOCK 309 from the DLL circuit 230. The QES/QED generator 340 also comprises a DLLR/F delay unit 560, which implements a delay upon the DLLCLOCK 309. In one embodiment, the DLLR/F delay unit 560 performs a matching delay function, which may match the pulse width of the DLLR and the DLLF signals 312, 315. The DLLR/F delay unit 560 produces an XDLLD signal on a line 565, which is a delayed version of the DLLCLOCK on the line 309.

The XDLLD signal 565 and the CLKD 307 signal are then sent to a phase detect unit 570 that detects the phase difference between the CLKD signal 307, which is the buffered XCLK 302, and the delayed DLLCLK 309 signal (XDLLD 565). Based upon this comparison, the phase detect unit 570 generates a digital logic signal DLLEARLY on the line 575. Effectively, the phase detect unit 570 examines the phase difference between CLKD (307) and a delayed version of the DLLCLOCK 309 signal. In one embodiment, the phase detect unit 570 makes a phase comparison based upon the rising edges of the input signals. Based upon the phase differences, the DLLEARLY signal on the line 575 is asserted if the delayed DLL clock signal 309 (XDLLD 565) has a phase that is earlier than the phase of the buffered external clock signal (CLKD 307). Utilizing the DLLEARLY signal 575, the latency adjustment unit 550, using the Q signals 525, 534, 536, 538, generates the QES and the QED signals 345, 342. A more detailed description of the latency adjustment unit 550 is provided in FIG. 7 and accompanying description below.

Figure 6:
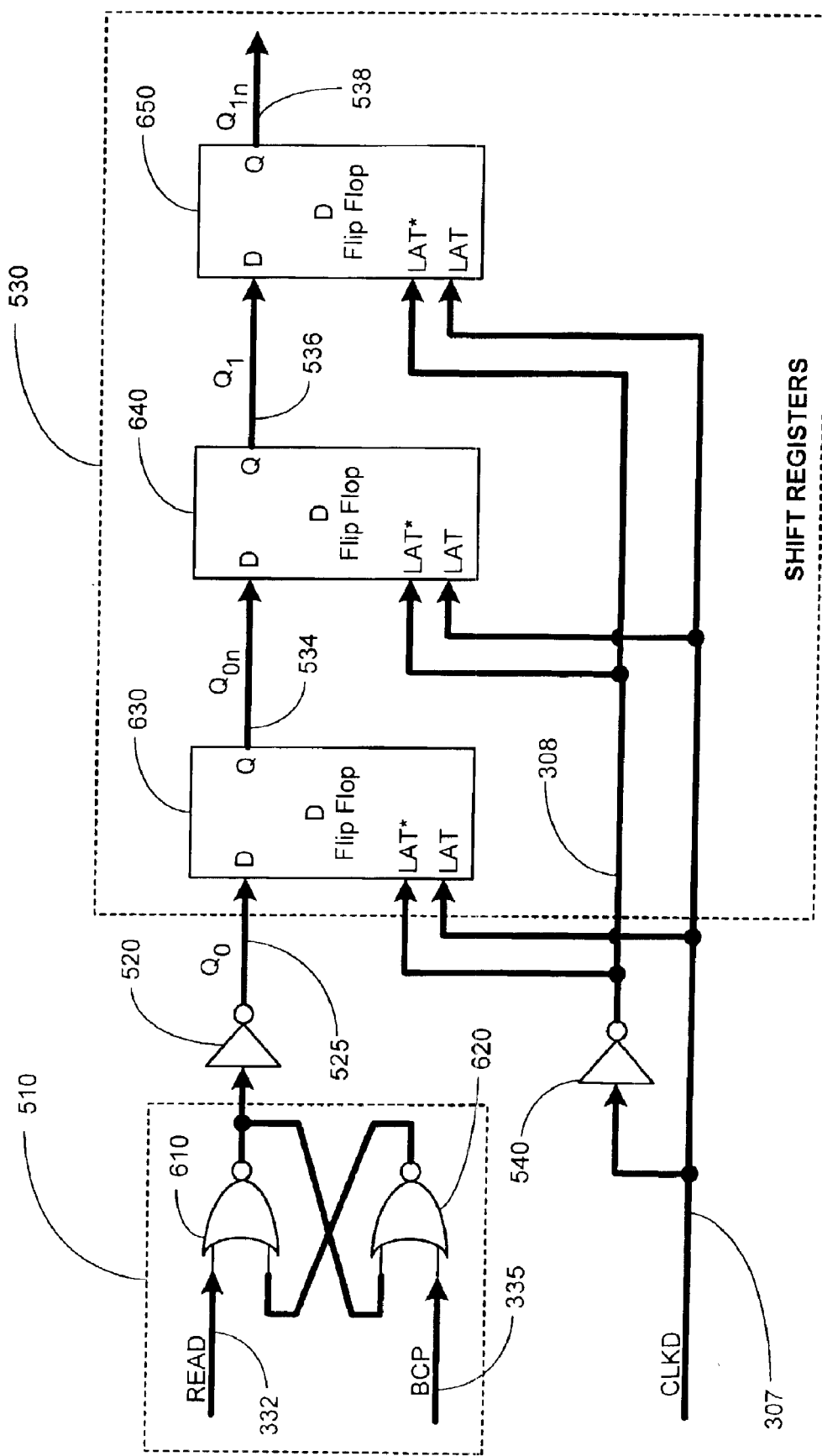
FIG. 6 illustrates a more detailed block diagram depiction of a shift register of FIG. 5, in accordance with one illustrative embodiment of the present invention.

Turning now to FIG. 6, a more detailed description of the shift register 530 in the QES/QED generator 340, in accordance with one embodiment of the present invention, is illustrated. The QES/QED generator 340 comprises the flip flop 510 that generates the $Q_0$ signal 525 after being inverted by the inverter 520. The READ signal 332 is sent to a NOR gate 610 whose output is fed back into a first input terminal of a second NOR gate 620. The output of the second NOR gate 620 is fed back to an input terminal of the first NOR gate 610. The BCP signal 335 is sent to a second input terminal of the second NOR gate 620. Based upon the feedback setup, the flip flop 510 produces a signal that is inverted by the inverter 520 to produce the $Q_0$ signal 525. The $Q_0$ signal 525 is then sent to the shift register 530, which comprises a first, second, and a third D-flip flops 630, 640, 650. The signal $Q_0$ signal 525 is sent to the D input of the first D-flip flop 630.

The D-flip flops 630, 640, 650 are generally driven by the signals CLKD 307 and an inverted version of the CLKD signal on the line 308, which is produced by the inverter 540. The CLKD signal 307 is sent to the LAT input, which is a latch input, and the inverted CLKD signal 308 is sent to the LAT* input of the D-flip flops 630, 640, 650. Based upon the CLKD and the CLKD inverted signal 307, 308, the D-flip flop 630 clocks through its input signal $Q_0$ 525 to produce $Q_{0n}$ on the line 534. The second D-flip flop 640 clocks through the $Q_{0n}$ signal 534 to generate the $Q_1$ signal 536. Similarly, the third D-flip flop 650 may generate a $Q_{1n}$ signal 538 by clocking through the $Q_1$ signal 536. Using the D-flip flops 630, 640, 650, different delayed signal versions, which are based upon delays provided by the CLKD signal 307, are used to shift different strobe signals that may be used to generate strobe signals by the latency adjustment unit 550. Those skilled in the art having benefit of the present invention, may utilize other forms of shifting mechanisms, such as counters and/or other types of registers, and provide a plurality of shifter versions of the $Q_0$ signal 525.

Figure 7:
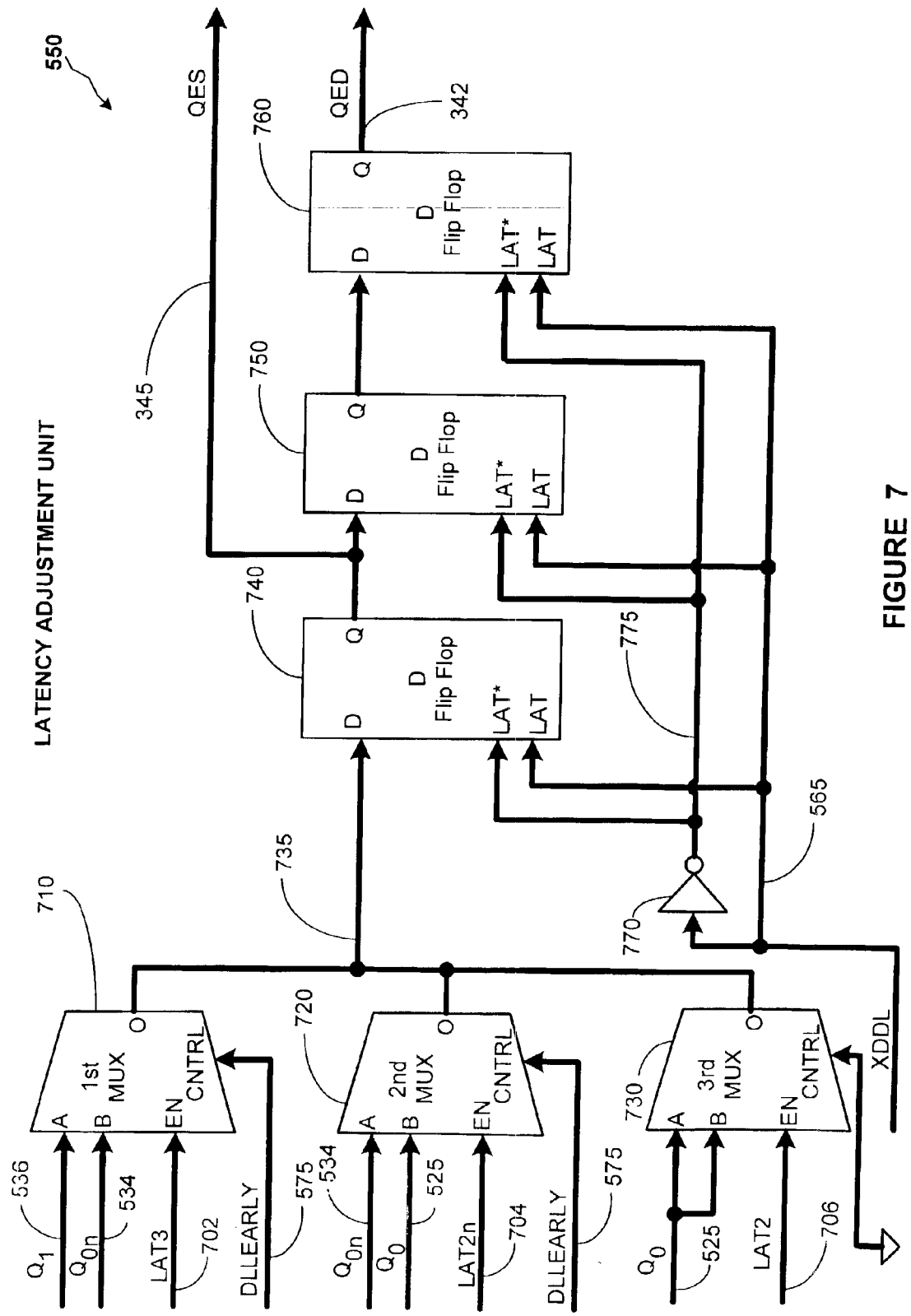
FIG. 7 illustrates a more detailed block diagram depiction of a latency adjustment unit of FIG. 5, in accordance with one illustrative embodiment of the present invention.

Turning now to FIG. 7, a more detailed illustration of the latency adjustment unit 550 in the QES/QED generator 340, in accordance with embodiments of the present invention, is illustrated. The latency adjustment unit 550 comprises a first, second and third multiplexer (first, second, and third MUXs) 710, 720, 730. Based upon a predetermined latency that may be known by the memory unit 130 or by the memory device 220, different latency signals may be provided for the operation of the latency adjustment unit 550. For example, a LAT3 signal 702 (latency=3 clocks, e.g., an external clock), a LAT2n signal 704 (latency=2.5 clocks), and a LAT2 signal 706 (latency=2 clocks), which may represent different latency operating modes, may be provided to the latency adjustment unit 550 for generating the QES and the QED signals 345, 342. Based upon the latency associated with the memory device 220, one of the latency signals LAT3, LAT2n, LAT2 702, 704, 706 is active.

The latency signals 702, 704, 706 are sent to the enable inputs of the multiplexers 710, 720, 730. Therefore, only one of the multiplexers 710, 720, 730 is active at any one time to produce a MUX output on the line 735. The Q signals 525, 534, 536, 538 resulting from the shift register 530 are provided to the multiplexers 710, 720, 730. The multiplexers 710, 720, 730 generally have two input terminals, terminals A and B. The first multiplexer 710 receives the $Q_1$ signal 536 on terminal A and the $Q_{0n}$ signal 534 on the input terminal B. The second multiplexer 720 receives the $Q_{0n}$ signal 534 on its terminal A and the $Q_0$ signal 525 on its terminal B. The third multiplexer 730 receives the $Q_0$ signal 525 on both of its input terminal, terminals A and B, therefore, if the third multiplexer is enabled by the LAT2 signal 706 for that particular latency, the $Q_0$ signal 525 provides the signal for generating the output of the multiplexer 730, which is used to generate the QES and QED signals 345, 342.

When the latency indicator signal LAT3 702, which is sent to the enable terminal of the first multiplexer 710, is asserted, the first multiplexer 710 is enabled. When the first multiplexer is enabled, the DLLEARLY signal 575, which is a control signal into the first and second multiplexers 710, 720, chooses between the signals input into the A and B terminals. The DLLEARLY signal 575, when asserted, chooses the B signal $Q_{0n}$ signal 534 to be the output of the first multiplexer 710. When the DLLEARLY signal 575 is not asserted, and the first multiplexer 710 is enable by the LAT3 signal 702, the output of the first multiplexer 710 will contain the $Q_1$ signal 536, which is transmitted onto the MUX output signal on the line 735.

When the latency indicator signal LAT2n 704, which is sent to the enable terminal of the second multiplexer 720, is asserted, the second multiplexer 720 is enabled. Based upon the state of DLLEARLY 575 from the phase detect unit 570, the output of the multiplexer may be either the $Q_{0n}$ signal 534 or the $Q_0$ signal 525, depending on the state of DLLEARLY 575. When the second multiplexer 720 is asserted, the output of the second multiplexer 720 is placed onto the line 735.

Based upon the assertion of the latency indicator signal LAT2 706, which is sent to the enable terminal of the third multiplexer 730, the signal on the line 735 is controlled by the third multiplexer 730. When the third multiplexer 730 is enabled, the output of the third multiplexer 730 will be the $Q_0$ signal 525 since the control signal into the third multiplexer 730 is generally hardwired to ground. Therefore, when the latency is represented by the LAT2 signal 706, the $Q_0$ signal 525 is placed on the multiplexer output line 735.

The output of the multiplexer on the line 735 generally reflects the strobe signal with different phases, which are sent through a shifting circuit that comprises the three D-flip flops 740, 750, 760. The D-flip flops 740, 750, 760 are operated by the delayed DLLCLOCK signal 309 (XDLLD 565), which is inverted by an inverter 770 to produce an inverted version of XDLLD on a line 775. These signals are used to clock and operate the operation of the D-flip flop 740, 750, 760. The shifted output of the multiplexer output 735, which is shifted by the D-flip flop 740, is used to generate the QES signal on the line 345. This signal is shifted further by two D-flip flops 750 and 760 to produce the QED signal 342. As described above, the QES and the QED signals 345, 342 are then used to provide data output by providing signals to the output drivers 229 to generate the data output strobe 414 and the data output signal 412, which are provided on the DQ pad 430 and the DQS pad 440.

Figure 8:
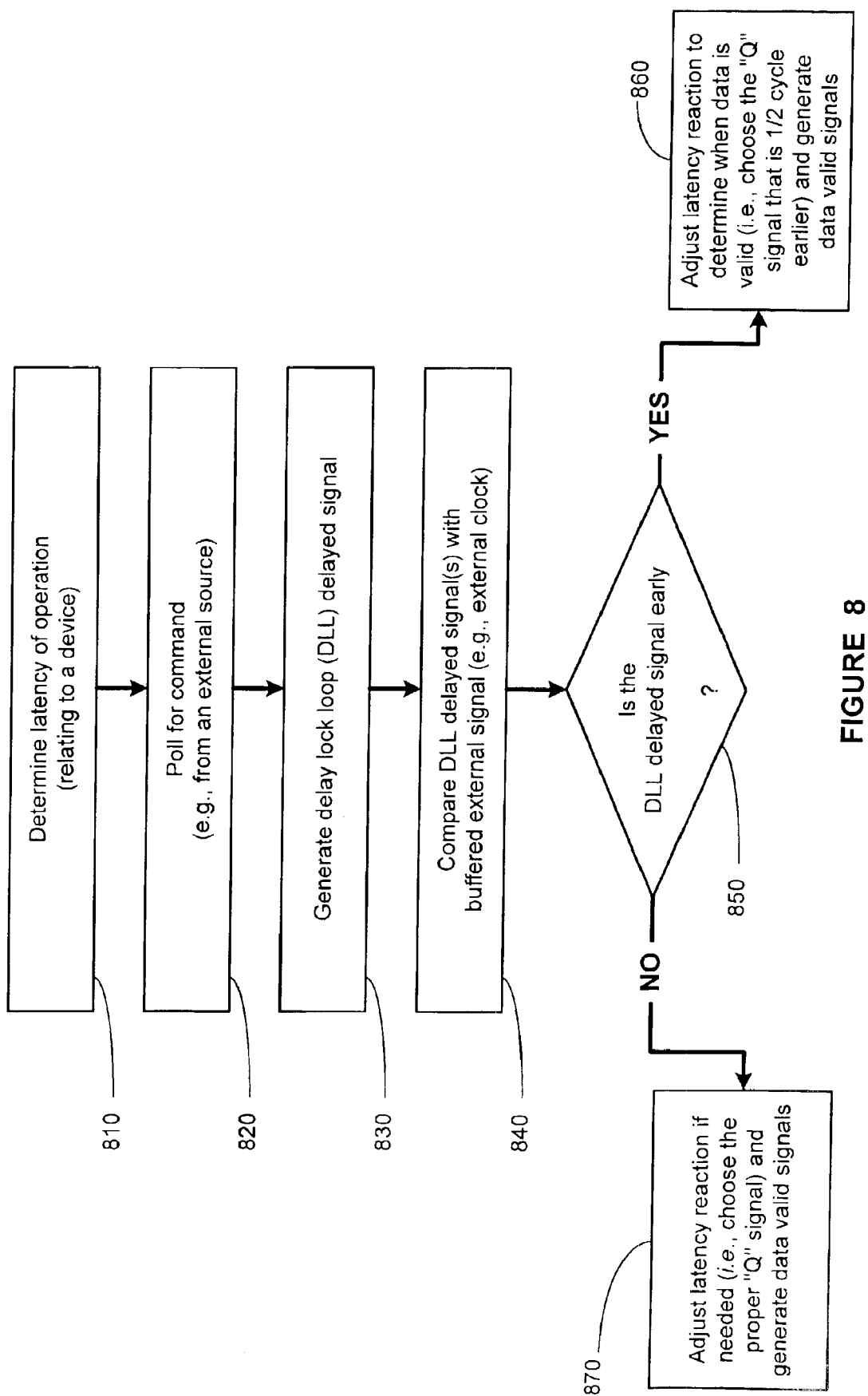
FIG. 8 illustrates a flowchart representation of a method in accordance with one illustrative embodiment of the present invention.

Turning now to FIG. 8, a simplified flow chart diagram of the method in accordance with embodiments of the present invention is illustrated. The system 100 may determine a latency of operation relating to the memory device 220 (block 810). In one embodiment, the latency of operation may be provided by an external device. The latency of operation may comprise factors such as the operation characteristics of the memory device 220, the operating clock speed, and the like. The system 100 also polls for a command to determine whether an access to or from the memory device 220 is to be performed (block 820). The system 100 also provides for generating a digital delay lock loop delayed clock signals for internal operation of the memory device 220, which is performed internally in a DRAM device (block 830).

The system 100 may also determine a phase difference by performing a comparison between the DLL delayed clocks and a buffered external clock (block 840). The compared DLL delayed clocks may be the strobes of the rising and falling edge of a delayed DLLCLOCK 309, which may be used by a DDR-type system for strobing data at the rising and falling edges of a clock. The system 100 then determines if the DLL delay signal is early (block 850). If the system 100 determines that the DLLCLOCK 309 is early for one of a number of reasons, such as inherent latency and/or other factors, the system 100 may perform an adjustment to the latency reaction by the memory device 220 (block 860). The system 100 may choose the "Q" signal that is ½ cycle earlier and generate data valid signals. Therefore, the normal latency adjustments that produces a "data valid" signal may be modified by another signal that is generated in reaction to a determination that the DLLCLOCK 309 is early. If the DLLCLOCK 309 is not found to be early, the normal latency adjustment is performed to generate the data valid signals (block 870). The system 100 may choose the proper "Q" signal and generate data valid signals.

Based upon the method described above, a more robust timing arrangement that reacts to external factors, such as temperature and operating voltage, is used to adjust the latency adjustments provided by the clock control unit 227 to produce more accurate timing characteristics. Utilizing embodiments of the present invention, data valid signals may be generated where the data is valid on the rising and falling edge of operating clocks, thereby more efficient access to memory may be performed, particularly for DDR-type configurations. Embodiments of the present invention may be used for a variety of digital-type circuitry in addition to memory type devices. The embodiments described above may be utilized for latching, clocking, accessing, storing, reading data or addresses relating to a variety of devices, such as memory devices, processors, registers, and the like.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
    a delay lock loop to provide a delayed signal based upon a phase difference between a reference signal and a feedback signal; and
    a phase detect unit operatively coupled to said delay lock loop, said phase detect unit to detect a phase difference between said delayed signal and an external signal to adjust a signal in response to a latency associated with said device.

2. The device of claim 1, wherein said device is a memory device.

3. The device of claim 2, wherein said memory device is at least one of a static random access memory (SRAM), a dynamic random access memory (DRAM), a double-data rate DRAM (DDR DRAM), a Rambus DRAM (RDRAM), and a FLASH memory.

4. The device of claim 2, further comprising a circuit for modifying a timing of a data valid signal based upon said adjusting said reaction to said latency to indicate that data relating to said device is valid.

5. The device of claim 4, further comprising a command decode unit adapted to decode a command for a data operation relating to said device, said command decode unit to prompt said circuit to modify said timing of said data valid signal.

6. The device of claim 4, further comprising at least one multiplexer for selecting a timing signal for adjusting said timing of said data valid signal based upon a latency indicator signal.

7. The device of claim 2, further comprising at least one output driver for driving at least one of a data valid signal and a data signal.

8. A circuit, comprising:
    a delay lock loop (DLL) unit to receive a reference signal and provide a delay upon said reference signal to generate a delayed reference signal;
    a DLL rising and falling edge generator operatively coupled with said delay lock loop unit, said DLL rising and falling edge generator to generate a DLL rising edge signal and a DLL falling edge signal for performing a double data rate (DDR) data operation; and
    a phase detect unit to detect a phase difference between said delayed reference signal and an external signal for adjusting a timing of a data valid signal that indicates that data at an output terminal relating to said circuit is valid, based upon a latency of operation of said circuit in response to a determination that said phase difference indicates that said delayed reference signal is has a phase that is earlier than the phase of said external signal.

9. The circuit of claim 8, further comprising at least one multiplexer for selecting a timing signal for adjusting said timing of said data valid signal based upon a latency indicator signal.

10. The circuit of claim 8, further comprising at least one output driver for driving at least one of a data valid signal and a data signal.

11. The circuit of claim 8, further comprising a command decode unit adapted to decode a command for a data operation relating to said device, said command decode unit to prompt said phase detect unit to modify said timing of said data valid signal.

12. The circuit of claim 11, wherein said DLL rising and falling edge generator further comprising a plurality of shift registers for generating a plurality of signals to affect said timing of said data valid signal.

13. The circuit of claim 8, wherein said reference signal is a clock signal.

14. A system board, comprising:
a first device comprising a memory location for storing data and a clock control unit, said clock control unit comprising a delay lock loop to provide a delayed signal based upon a phase difference between a reference signal and a feedback signal and a phase detect unit operatively coupled to said delay lock loop, said phase detect unit to detect a phase difference between said delayed signal and an external signal to adjust a reaction to a latency associated with said first device in response to a determination that said phase difference indicates that said delayed signal is early; and
a second device operatively coupled to said first device, said second device to access data from said first device based upon an operation performed by said delay lock loop.

15. The system board described in claim 14, wherein said memory location is at least one of an SRAM, a DRAM, a DDR DRAM, a RDRAM, and a FLASH memory.

16. The system board of claim 14, wherein said system board is a motherboard of a computer system.

17. The system board of claim 14, wherein said first device further comprising a DLL rising and falling edge generator operatively coupled with said delay lock loop unit, said DLL rising and falling edge generator to generate a DLL rising edge signal and a DLL falling edge signal for performing a double data rate (DDR) data operation.

18. The system board of claim 17, wherein said DLL rising and falling edge generator further comprising a plurality of shift registers for generating a plurality of signals to affect said timing of a data valid signal.

19. The system board of claim 18, wherein said first device further comprising a command decode unit adapted to decode a command from said second device for a data operation relating to said first device, said command decode unit to prompt said phase detect unit to modify said timing of said data valid signal.

20. The system board of claim 18, wherein said first device further comprising at least one output driver for driving at least one of said data valid signal and a data signal.

21. The system board of claim 14, wherein said first device further comprising at least one multiplexer for selecting a timing signal for adjusting said timing of a data valid signal generated by said first device based upon a latency indicator signal.

22. The system board of claim 14, wherein said reference signal is a clock signal.

23. A memory device, comprising a delay lock loop to provide an output signal based upon a phase difference between a reference signal and a feedback signal, said delay lock loop comprising a phase detect unit to detect a phase difference between said delayed signal and an external signal to adjust a reaction to a latency associated with said device.

24. The memory device of claim 23, wherein said memory device is at least one of a static random access memory (SRAM), a dynamic random access memory (DRAM), a double-data rate DRAM (DDR DRAM), a Rambus DRAM (RDRAM), and a FLASH memory.

25. The memory device of claim 24, further comprising a circuit for modifying a timing of a data valid signal based upon said adjusting said reaction to said latency to indicate that data relating to said memory device is valid.

26. The memory device of claim 24, further comprising a command decode unit adapted to decode a command for a data operation relating to said device, said command decode unit to prompt said circuit to modify said timing of said data valid signal.

27. The memory device of claim 24, further comprising at least one multiplexer for selecting a timing signal for adjusting said timing of said data valid signal based upon a latency indicator signal.

28. The memory device of claim 24, further comprising at least one output driver for driving at least one of a data valid signal and a data signal.

29. A method, comprising:
determining a latency of operation relating to a data operation of a device;
generating a delay lock loop signal for said data operation of said device;
comparing said delay lock loop signal to an external clock to determine a phase difference;
determining whether said delay lock loop signal is early based upon said phase difference; and
adjusting a signal in response to said latency of operation based upon said determination that said delay lock loop signal is early.

30. The method of claim 29, wherein determining a latency of operation relating to a data operation of a device further comprises determining a latency of operation based upon at least one of an inherent latency relating to said device, temperature drift during an operation of said device, and operation voltage-level drifts relating to the device.

31. The method of claim 29, wherein determining whether said delay lock loop signal is early based upon said phase difference further comprises determining that an edge of said delay lock loop signal is asserted at a time period before an assertion of an edge of external clock.

32. The method of claim 29, wherein adjusting a reaction to said latency of operation further comprises adjusting the timing of a data valid signal that indicates that a data signal is valid.

33. An apparatus, comprising:
means for determining a latency of operation relating to a data operation of a device;
means for generating a delay lock loop signal for said data operation of said device;
means for comparing said delay lock loop signal to an external clock to determine a phase difference;
means for determining whether said delay lock loop signal is early based upon said phase difference; and means for adjusting a signal in response to said latency of operation based upon said determination that said delay lock loop signal is early.

34. A computer readable program storage device encoded with instructions that, when executed by a computer, performs a method, comprising:

determining a latency of operation relating to a data operation of a device;

generating a delay lock loop signal for said data operation of said device;

comparing said delay lock loop signal to an external clock to determine a phase difference;

determining whether said delay lock loop signal is early based upon said phase difference; and adjusting a signal in response to said latency of operation based upon said determination that said delay lock loop signal is early.

35. The computer readable program storage device encoded with instructions that, when executed by a computer, performs the method of claim 34, wherein determining a latency of operation relating to a data operation of a device further comprises determining a latency of operation based upon at least one of an inherent latency relating to said device, temperature drift during an operation of said device, and operation voltage-level drifts relating to the device.

36. The computer readable program storage device encoded with instructions that, when executed by a computer, performs the method of claim 34, wherein determining whether said delay lock loop signal is early based upon said phase difference further comprises determining that an edge of said delay lock loop signal is asserted at a time period before an assertion of and edge of external clock.

37. The computer readable program storage device encoded with instructions that, when executed by a computer, performs the method of claim 34, wherein adjusting a reaction to said latency of operation further comprises adjusting the timing of a data valid signal that indicates that a data signal is valid.

38. A memory device, comprising:

a delay lock loop (DLL) unit to receive a reference signal and provide a delay upon said reference signal to generate a delayed reference signal;

a DLL rising and falling edge generator operatively coupled with said delay lock loop unit, said DLL rising and falling edge generator to generate a DLL rising edge signal and a DLL falling edge signal for performing a double data rate (DDR) data operation; and a phase detect unit to detect a phase difference between said delayed reference signal and an external signal for adjusting a timing of a data valid signal that indicates that data at an output terminal relating to said circuit is valid, based upon a latency of operation of said circuit in response to a determination that said phase difference indicates that said delayed reference signal is has a phase that is earlier than the phase of said external signal.

39. The memory device of claim 38, further comprising at least one multiplexer for selecting a timing signal for adjusting said timing of said data valid signal based upon a latency indicator signal.

40. The memory device of claim 38, further comprising at least one output driver for driving at least one of a data valid signal and a data signal.

41. The memory device of claim 38, further comprising a command decode unit adapted to decode a command for a data operation relating to said device, said command decode unit to prompt said phase detect unit to modify said timing of said data valid signal.

42. The memory device of claim 41, wherein said DLL rising and falling edge generator further comprising a plurality of shift registers for generating a plurality of signals to affect said timing of said data valid signal.

43. The memory device of claim 38, wherein said reference signal is a clock signal.

44. The memory device of claim 38, wherein said memory device is at least one of a static random access memory (SRAM), a dynamic random access memory (DRAM), a double-data rate DRAM (DDR DRAM), a Rambus DRAM (RDRAM), and a FLASH memory.

* * * * *